United States Patent [19]

Harlos et al.

[11] Patent Number: 4,805,021
[45] Date of Patent: Feb. 14, 1989

[54] CONTROL CIRCUIT FOR CALIBRATING A DELAY LINE

[75] Inventors: Hartmut Harlos, Norderstedt; Klaus G. H. Juhnke, Rellingen; Peter Kelting, Elmshorn, all of Fed. Rep. of Germany

[73] Assignee: U.S. Philips Corporation, New York, N.Y.

[21] Appl. No.: 939,385

[22] Filed: Dec. 8, 1986

[30] Foreign Application Priority Data

Dec. 14, 1985 [DE] Fed. Rep. of Germany ....... 3544342

[51] Int. Cl.$^4$ .............................................. H04N 5/14
[52] U.S. Cl. .................................... 358/160; 358/139; 358/148
[58] Field of Search ............... 358/148, 149, 160, 158, 358/17, 139, 188; 307/511, 603, 606

[56] References Cited

U.S. PATENT DOCUMENTS 4,489,342 12/1984 Gollinger et al. .................... 358/17

FOREIGN PATENT DOCUMENTS 0059802 9/1982 European Pat. Off. ............ 358/188

OTHER PUBLICATIONS

Achterberg et al., "Versteilerung von Farbsignalsprüngen und Leuchtchichtesignal-Verzögerung mit der Schaltung TDA 4560", Valvo Technical Information 840228, pp. 1–13.

Primary Examiner—James J. Groody
Assistant Examiner—David E. Harvey
Attorney, Agent, or Firm—Gregory P. Gadson

[57] ABSTRACT

Control circuit for calibrating a delay line for a television receiver. The delay line contains series-connected all-pass sections of at least 2nd-order, the inductances of which are replaced by gyrators to which capacitances are connected. During at least one line of the vertical blanking period, the delay line is included into a phase-lock loop for comparison with a line-frequency signal in order to control the delay time of the all-pass sections.

3 Claims, 2 Drawing Sheets

CONTROL CIRCUIT FOR CALIBRATING A DELAY LINE

BACKGROUND OF THE INVENTION

The invention relates to a control circuit for calibrating a delay line for a television receiver, which consists of series-connected all-pass sections of at least 2nd-order, the inductances of which are replaced by gyrators to which capacitances are connected.

Such a delay line containing 2nd-order seriesconnected all-pass sections is known from Valvo publication "Technical Information 840228" (TDA 4560). In all-pass sections, only the phase response of the transfer function depends on the frequency while the amplitude response is independent of frequency. For unmodulated signals, an all-pass section produces a delay which represents the phase delay. Since inductances are required for such all-pass sections which do not contain any active components, and these inductances cannot be integrated on a semiconductor substrate, the inductance has been replaced by a gyrator to which a capacitance is connected. This makes it possible to implement an all-pass section with the aid of transistors, capacitances and resistances on an integrated circuit.

The capacitances used are integrated as depletion layer capacitances. Since the vaalue of a depletion layer capacitance depends on the bias voltage applied to it, as is known, it is possible, on the one hand, to change the delay time of an all-pass section within a limited range by means of the bias voltage and, on the other hand, to use the voltage-dependence of the capacitances for automatically compensating for unwanted influences. In theknown circuit arrangement, a bias voltage can be derived by comparing an internal resistance with an external reference resistance which has a particular resistance value, which bias voltage is used for controlling the values of the depletion layer capacitances of the all-pass sections in such a manner that the delay time becomes independant of the doping and the geometric structural dimensions of the integrated circuit and of the temperature and of the supply voltage. However, it has been found in the production of such delay lines that variations occur which are so large that compensation of the unwanted influences is not completely achieved with the external reference resistance.

SUMMARY OF THE INVENTION

The invention is based on the object of developing a control circuit for calibrating a delay line of the type initially mentioned in such a manner that, in an implementation of the delay line as integrated circuit, the yield is increased.

According to the invention, the object is achieved by the fact that the input of the delay line is connected to a change-over switch which supplies this input in a first position with the output signal of the delay line which has been passed via an amplifier, that an oscillator formed of the delay line and the amplifier is a part of a phase-lock loop which generates from the comparison between a line-frequency signal and the output signal of the amplifier a control signal for the all-pass sections which is stored during the first position of the change-over switch, and thus controls their delay time, and that the second position of the change-over switch occurs during at least one line of the vertical blanking period.

It should be mentioned tha a timing-error correction device containing a delay line which is to be calibrated is known from "Radiomentor electronic, volume 37, 1966, No. 4, pages 301 to 303". The delay time of the delay line can be set by means of selecting a tap on this line. Each tap of this delay line is connected to a control circuit which is in each case connected only to this tap, and in which the delayed television signal is passed through when the output signal of the delay line and a reference signal are coincident in time. This calibration is carried out at the beginning of each line. Compared with the known device, the circuit arrangement according to the invention differs in that, for the purpose of controlling, an oscillator containing the delay line is used which is a component of a phase-lock loop, for calibrating the delay time of the delayline to the nominal value. In addition, the delay line is not implemented by gyrators in which capacitances are connected in the known circuit arrangement.

In the circuit arrangement according to the invention, the delay time of the individual all-pass sections is controlled. This is effected by the fact that during the vertical blanking period (which is the period in which the field change occurs), the delay line, together with an amplifier, forms an oscillator which is a part of a phase-lock loop. For this purpose, it is necessary that the change-over switch changes to a second position, and thus no television signal reaches the input of the delay line. Since the phase comparison is effected during the vertical blanking period and then no picture information is present, the visible picture is also not disturbed. The control signal generated by the phase-lock loop is stored until the following vertical blanking period in which the next comparison takes place, so that a control signal is always present at the all-pass sections of the delay line. In the phase-lock loop, the comparison between a line-frequency signal and the output signal of the amplifier is carried out during the second position of the change-over switch. As a result, the delay line can be used in all currently used television standards since the delay time is automatically adapted to the respective line frequency.

In a first development of the invention, it is provided that the phase-lock loop comprises a frequency divider and a phase comparison circuit which generates the control signal in accordance with the comparison between the line-frequency signal and the output signal of the amplifier which is supplied to the phase comparison between the line-frequency signal and the output signal of the amplifier which is supplied to the phase comparison circuit via the frequency divider. The frequency of the output signal of the frequency divider, which divides the frequency of the output signal of the amplifier, is almost equal to the line frequency. This frequency-divided signal is used in the subsequent phase comparison circuit for carrying out the comparison between this signal and a line-frequency signal separated from the total television signal.

In another development of the invention, it is provided that the control signal is stored ina capacitor. The phase comparison circuit generating the control signal and the capacitor are designed in such a manner that the phase comparison circuit rapidly charges the capacitor uring the vertical blanking period and that the control signal stored in the capacitor remains largely constant between the vertical blanking periods.

The condition of oscillation for the oscillator formed of amplifier and delay line must be maintained with respect to amplitude and phase. For this reason, it is provided that the amplifier comprises a stage which inverts the output signal of the delay line.

Since an oscillator signal is to be generated by the oscillator only during the second position of the change-over switch, it is provided that the amplifier is switched on only in the second position. It is furthermore provided that, due to the switching-on, the amplifier starts the oscillator signal at a predetermined phase angle. Since a signal for switching the amplifier on is already available, this signal can also be used at the same time for starting the oscillator signal. The amplifier can then be switched on bymeans of a switching-on pulse generated from the horizontal pulses.

Since the oscillator signal then starts in a particular phase relationship to the horizontal pulse, the comparison can be effected in such a manner that during the next horizontal pulse following the horizontal pulse activating the oscillator, the phase comparison circuit compares the output signal of the frequency divider with a pulse obtained from the horizontal pulse.

BRIEF DESCRIPTION OF THE DRAWINGS

In the text which follows, illustrative embodiments are explained with the aid of the drawings, in which.

DETAILED DESCRIPTION OF THE INVENTION

Figure 1:
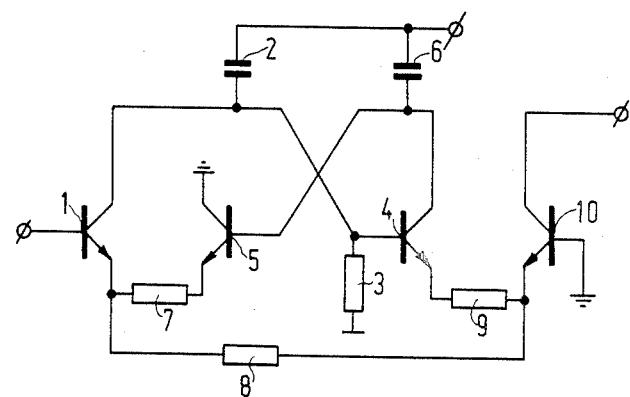
FIG. 1 shows a basic circuit diagram of a 2nd-order all-pass section as the basic element of a delay line.

FIG. 1 shows the basic circuit diagram of a 2nd-order all-pass section which is known from Valvo publication "Technical Information 840228". In all-pass sections, only the phase response of the transfer function for sinusoidal signals depends on the frequency whereas the amplitude response is independent of frequency. Since, for unmodulated signals, such all-pass sections produce a delay which is identical with the phase delay, delay lines can be implemented from series-connected all-pass sections which are used, for example, for delaying the luminance signal in a television receiver. 2nd-order all-pass sections which are implemented only with passive elements, need inductances in addition to resistances and capacitances. However, in order to be able to use such an all-pass section completely in an integrated circuit, the inductance must be replaced with the aid of active components.

In the circuit according to FIG. 1, the inductance has been simulated by a gyrator and a capacitance. By gyrator, a two-port network having the following characteristic is meant: if the two-port network is terminated on one of its sides by a two-terminal network having the impedance Z, an impedance differing from 1/Z by only a positive constant factor is created on the other side of the two-port network. A gyrator terminated at the output with a capacitance therefore acts like an inductance at the input.

To show how the gyrator is implemented in the circuit according to FIG. 1, the configuration of the entire circuit will first be discussed in the text which follows. The input signal is supplied to the base of an npn transistor 1. The collector of the transistor 1 is connected to one electrode of a capacitor 2, to a resistor 3 which is connected to earth and to the base of an npn transistor 4. A further connection exists between the collector of the transistor 4 and the base of an npn transistor 5, the collector of which is connected to earth. One electrode of a capacitor 6 is also connected to the collector of the transistor 4. The other electrode of the capacitor 6, like the second electrode of the capacitor 2, is supplied with a control signal by means of which it is possible to adjust the delay time of the all-pass section. The emitter of the transistor 5 is coupled via a resistor 7 to the emitter of the transistor 1. In addition, the emitter of the transistor 1 is connected via a resistor 8, and the emitter of the transistor 4 is connected via a resistor 9, to the emitter of an npn transistor 10. The base of this transistor 10 is connected to earth. The output signal of the all-pass section is applied to the collector of the transistor 10. The gyrator, the output of which is terminated by a capacitance, is implemented by means of the transistors 1 and 4 and of the capacitor 6. The resonant frequency of this all-pass section is determined by the resistors 7 and 9 and by the capacitors 2 and 6. Further information on the 2nd-order all-pass section shown here can be found in the above mentioned publication.

Figure 2:
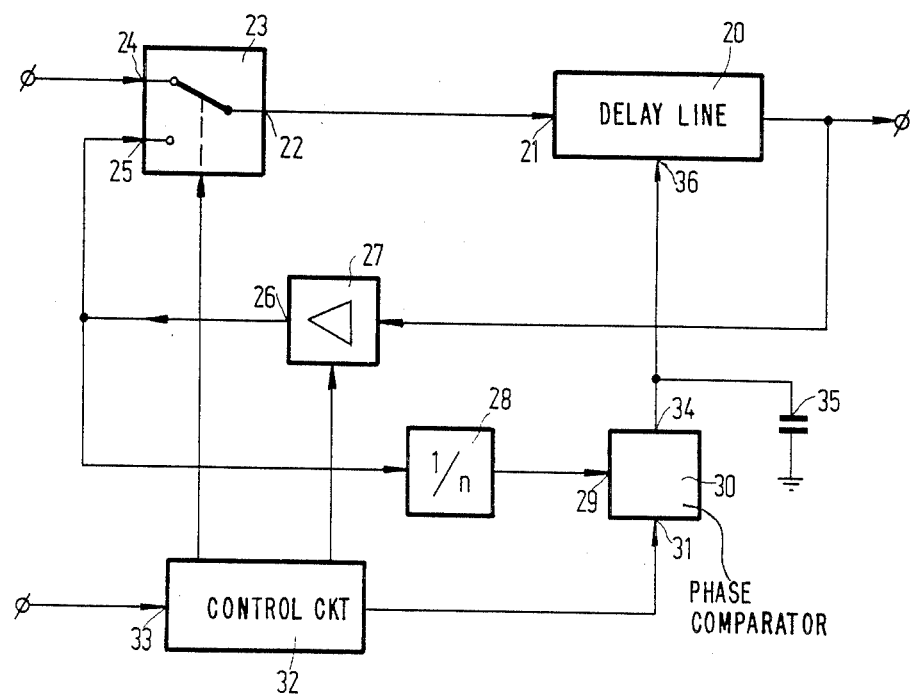
FIG. 2 shows an illustrative embodiment of the invention.

FIG. 2 describes an illustrative embodiment of the invention which contains a delay line 20 which consists of series-connected 2nd-order all-pass sections according to FIG. 1. The input 21 of the delay line 20 is connected to an output 22 of a change-over switch 23. The input 24 of the change-over switch 23 is supplied, for example, with a luminance signal which is to be delayed in the delay line. The input 25 of the change-over switch 23 is connected to an output 26 of an amplifier 27 which contains an inverting stage. In the first position of the change-over switch 23, it connects the input 24 to the output 22, and in the second position, it connects the input 25 to the output 22. The output signal of the delay line 20 is supplied to the amplifier 27.

The output signal of the amplifier 27 is also fed via a frequency divider 28 to the input 29 of a phase comparison circuit or phase comparator 30. The other input 31 of the phase comparison circuit 30 is supplied with pulses (reference signal) obtained from the horizontal pulses in a control circuit 32. In addition, the control circuit 32 generates a switching-on signal for the amplifier 27 and a change-over signal for the change-over switch 23 from the synchronization pulses supplied to the input 33.

The output 34 of the phase comparison circuit 30 is connected to a capacitor 35 which is connected to earth. The control signal generated by the phase comparison circuit 30 is supplied via the output 34 to a control signal input 36 of the delay line 20.

If the change-over switch 23 is in its second position, amplifier 27 and delay line 20 form an oscillator. The delay line 20 then acts as a feedback network.

This oscillator is a part of a phase-lock loop formed with the frequency divider 28 and the phase comparison circuit 30, for controlling the delay time of the delay line 20 or of the all-pass sections contained in it, respectively. The delay time is controlled during one or several line periods within the vertical blanking period. There is no picture information present during the vertical blanking period. In addition the change between two fields occurs then. When the change-over switch is in its second position, the amplifier 27 is also switched on by a switching-on signal supplied by the control circuit 32, and the frequency-divided ouput signal of the amplifier 27 is compared in the phase comparison circuit with a reference signal derived from the horizontal pulses by the control circuit 32. In accordance with this comparison, the delay time is adjusted by means of a control signal in the delay line 20. Since the control signal is stored in the capacitor 35, a constant control signal is present at the control signal input 36 of the delay line 20 even during the period during which the change-over switch 23 is in its first position. The delay time is only controlled within the vertical blanking period. Thus, no disturbances due to the control process can become visible on the screen. Since the reference signal is obtained from a line-frequency signal, such a circuit arrangement can be used for all currently used television standards.

Figure 3:
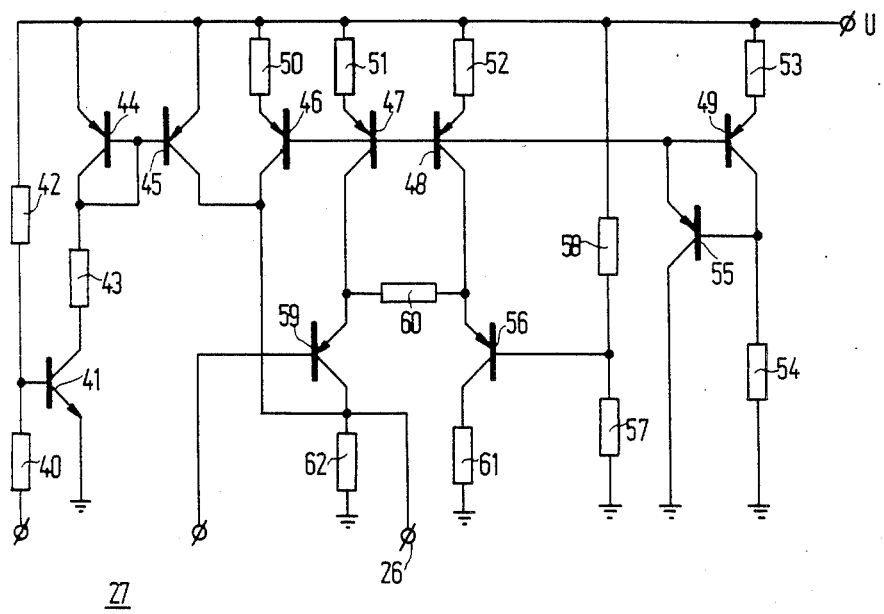
FIG. 3 shows a detailed illustrative embodiment of the amplifier used in FIG. 2.

To explain the generation of oscillation of the oscillator formed of amplifier 27 and delay line 20 and for sequence control, a detailed illustrative embodiment of the amplifier 27 is shown in FIG. 3. The base of an npn transistor 41, the emitter of which is connected to earth, is supplied with a switching-on signal via a resistor 40. The base of the transistor 41 is connected via a resistor 42 to a supply source U. The collector of the transistor 41 is connected via a resistor 43 to a current-mirroring circuit which is formed of pnp transistors 44 and 45. The collector and the base of the tansistor 44 and the base of the transistor 45 are connected to the resistor 43 and the emitters of the transistors 44 and 45 are connected to the supply source U.

The collector of the transistor 45 is connected together with the collector of a pnp transistor 46 the base of which is connected to the bases of pnp transistors 47, 48 and 49. The emitter of the transistor 46 is connected via a resistor 50, the emitter of the transistor 47 is connected via a resistor 51 and the emitter of the transistor 48 is also connected via a resistor 52 to the supply source U.

The emitter of the transistor 49 is connected to the supply source via a resistor 53, and the collector is connected to a resistor 54 which is connected to earth. The base of the transistor 49 also has a connection to the emitter of a pnp transistor 55 the base of which is connected to the collector of the transistor 49 and the collector of which is connected to earth. The transistors 49 and 55 are used for providing the appropriate base voltage for the transistors 46, 47 and 48, which are connected as current sources.

The collector of the current source transistor 48 is coupled to the emitter of a pnp transistor 56. The base of the transistor 56 is connected to a voltage divider formed of a resistor 57 connected to earth and a resistor 58 connected to the supply source. The collector of the current source transistor 47 is connected to the emitter of a pnp transistor 59, the base of which is supplied with the input signal. The emitters of the two transistors 56 and 59 are coupled to a resistor 60. The two transistors 56 and 59, forming a differential amplifier, have in each case collector resistors 61 and 62. Finally, there is also a connection between the collector of the transistor 45 and the collector of the transistor 59. The output signal of the amplifier 27 can be picked up at the collector of the transistor 59.

Figure 4:
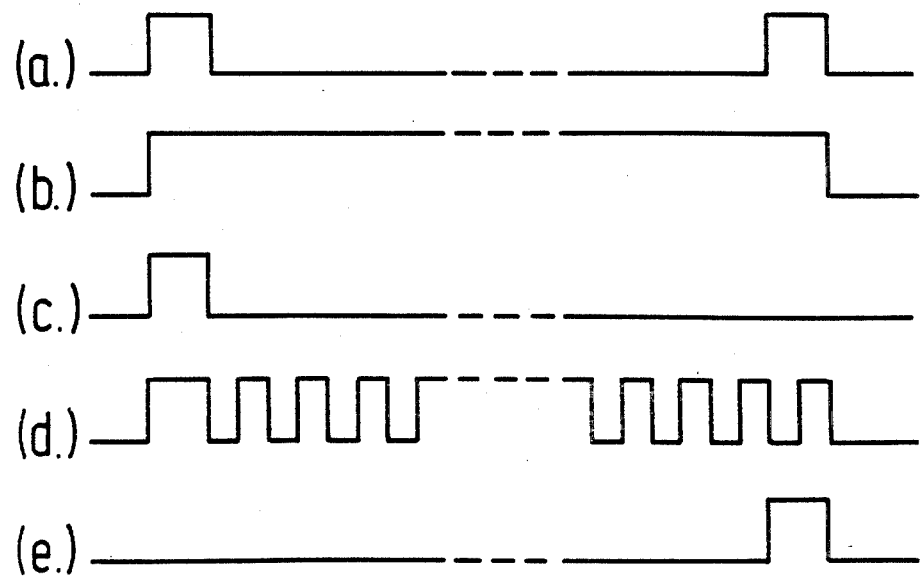
FIG. 4 shows various signals used in the circuit arrangement according to FIG. 2.

In the text which follows, FIG. 4 is used for explaining in greater detail the operation of the amplifier according to FIG. 3 and also specifying in greater detail the sequence of the control process. The change-over switch should be in its second position only during one line in the vertical blanking period. The input 33 of the control circuit 32 is supplied, for example, with the mixed synchronizing signal from which a conventional separating circuit is then used in the control circuit for obtaining the horizontal pulses and an identifying pulse which shows when the vertical blanking period is present. Three different pulses generated by the control circuit 32 are needed for controlling and for the comparison in the phase-lock loop. In FIG. 4, two successive horizontal pulses are shown in diagram a. From these, the change-over signal for the change-over switch 23, shown in diagram b, is generated in the control circuit 33. In addition, the switching-on signal for the amplifier, which corresponds to the first horizontal pulse, is drawn in diagram c and the reference signal, which corresponds to the second horizontal pulse and which is supplied to the input 31 of the comparison circuit 30 is shown in diagram e. The positive switching-on signal shown in diagram c of FIG. 4 generates a positive voltage at the collector of the transistor 59. This signal is supplied via the input 21 to the delay line 20 and delayed by the delay time of this line. After the positive switching-on pulse of the amplifier 27 has finished, the signal fed back via the delay line 20 and present at the base of the transistor 59 can be supplied to the output 26 of the amplifier 27. Since the transistor 59 inverts the input signal, the oscillator signal or the output signal of the amplifier jumps to a more negative potential. This signal is again delayed by one delay period in the delay line 20 and then inverted in the amplifier 27 so that the oscillator generates a frequency which is inversely proportional to twice the delay time. The output signal generated by the amplifier 27 is drawn in diagram d of FIG. 4.

An all-pass section of the delay line 20 is to delay a signal by 100 ns, that is to say the delay time of the entire delay line 20 is 1000 ns if 10 all-pass sections are used. So that the frequency divider 28 divides the frequency of the output signal of the amplifier 27 to 15,625 kHz (the frequency of the horizontal pulses), the divider ratio must be equal to 32. The frequency divider receives the signal from the collector of the transistor 59. The output signal of the frequency divider 28 and the reference signal of the control ciruct 32, which is drawn in diagram e of FIG. 4, are compared in phase in the phase comparison circuit 30 and a control signal is generated which corresponds to this phase comparison. Such a phase comparison is known, for example, from the journal "Funkschau", 1976, volume 7, page 257 to 259.

A particular number of delay lines is necessary for generating the oscillator signal the frequency of which is matched to the line frequency. This is because the frequency is inversely proportional to twice the delay time. However, in order to delay a luminance signal for a shorter or longer period in the first position of the change-over switch 23, it can be provided that all-pass sections are disconnected or connected.

What is claimed is:

1. Control circuit for calibrating a delay line for a television receiver, said delay line having series-connected all-pass sections of at least 2nd-order, and gyrators in place of inductors, to which capacitances are connected, said control circuit comprising an input of the delay line connected to a change-over switch which supplies the input in a first position with a television signal and in a second position with a signal derived from the output signal of the delay line, which derived signal has been passed through an amplifier, an oscillator being formed by the delay line and the amplifier which is a part of a phase-lock loop which generates from a comparison made by a phase comparison circuit between a line-frequency signal and the derived signal from the amplifier, a control signal which is stored by a means for storing during the second position of the change-over switch, for the all-pass sections, said control signal controlling the delay time of said delay line, and the second position of the change-over switch occurs during at least one line of the vertical blanking period, wherein the amplifier which inverts the output signal of the delay line, is switched on only during the second position, and because of the switching on, said amplifier starts an oscillator signal at a predetermined phase angle.

2. Control circut for calibrating a delay line for a television receiver according to claim 1, characterized in that the switching on is effected with a switching-on pulse generatd from a first horizontal pulse.

3. Control circuit for calibrating a delay line for a television receiver according to claim 2, characterized in that, during a next horizontal pulse following the first horizontal pulse activating the oscillator, the phase comparison circuit compares the output signal of the frequency divider with a pulse obtained from the next horizontal pulse.

* * * * *